US009525390B2

(12) United States Patent
Ibusuki

(10) Patent No.: US 9,525,390 B2
(45) Date of Patent: Dec. 20, 2016

(54) SWITCHING CIRCUIT

(71) Applicant: ROHM CO., LTD., Ukyo-Ku, Kyoto (JP)

(72) Inventor: Takayuki Ibusuki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/830,183

(22) Filed: Aug. 19, 2015

(65) Prior Publication Data

US 2016/0056771 A1    Feb. 25, 2016

(30) Foreign Application Priority Data

Aug. 19, 2014   (JP) .................................. 2014-166882

(51) Int. Cl.
*H03F 3/217* (2006.01)
*H03F 3/185* (2006.01)
*H03F 3/45* (2006.01)

(52) U.S. Cl.
CPC ............ *H03F 3/2171* (2013.01); *H03F 3/185* (2013.01); *H03F 3/2173* (2013.01); *H03F 3/45475* (2013.01); *H03F 2200/03* (2013.01); *H03F 2200/144* (2013.01); *H03F 2200/213* (2013.01); *H03F 2200/321* (2013.01); *H03F 2200/391* (2013.01); *H03F 2203/45512* (2013.01); *H03F 2203/45528* (2013.01); *H03F 2203/45594* (2013.01)

(58) Field of Classification Search
CPC ...... H03F 1/3205; H03F 3/211; H03F 3/2171; H03F 2200/03; H03F 2200/144; H03F 2200/213; H03F 2200/391
USPC ......... 257/195; 323/222, 271, 282; 327/131, 327/552; 329/308; 330/10; 341/152; 363/98, 363/126; 381/121, 123, 74; 455/114.3, 127.1, 455/127.2, 206; 315/85; 318/400.1; 324/706; 375/242, 367, 373
See application file for complete search history.

(56) References Cited

U.S. PATENT DOCUMENTS

| | | | | |
|---|---|---|---|---|
| 4,095,047 A * | 6/1978 | von Pieverling | ...... | H04B 7/216 375/344 |
| 4,545,061 A * | 10/1985 | Hileman | ................ | H04B 1/707 375/145 |
| 4,618,818 A * | 10/1986 | Horn | ...................... | G01D 3/036 324/706 |
| 4,878,251 A * | 10/1989 | Richardson | .............. | H04B 1/12 455/206 |
| 4,980,779 A * | 12/1990 | Sakata | ................. | H04N 9/7912 386/202 |
| 4,992,751 A * | 2/1991 | Attwood | ................... | H03F 3/38 330/10 |

(Continued)

FOREIGN PATENT DOCUMENTS

JP    2008228029 A    9/2008

*Primary Examiner* — Gerald Gauthier
(74) *Attorney, Agent, or Firm* — Cantor Colburn LLP

(57) ABSTRACT

A switching circuit generates a switching pulse that is pulse modulated according to an input signal. An error amplifier includes a phase compensating filter that generates a feedback signal corresponding to the switching pulse. The error amplifier generates an error signal corresponding to a difference between the input signal and the feedback signal. A pulse modulator includes an oscillator that generates a carrier signal having a variable frequency. The pulse modulator pulse-modulates the carrier signal according to the error signal, so as to generate a pulse modulated signal. The phase compensating filter is configured such that its frequency characteristics can be adjusted according to the frequency of the carrier signal.

19 Claims, 9 Drawing Sheets

(56) References Cited

U.S. PATENT DOCUMENTS

| | | | | |
|---|---|---|---|---|
| 5,065,107 A * | 11/1991 | Kumar | H04B 1/30 | 329/308 |
| 5,523,715 A * | 6/1996 | Schrader | H03F 3/38 | 330/10 |
| 5,615,411 A * | 3/1997 | Abbey | H03D 3/002 | 329/316 |
| 5,781,067 A * | 7/1998 | Tota | H03F 3/2171 | 330/10 |
| 6,016,075 A * | 1/2000 | Hamo | H03F 3/2171 | 330/10 |
| 6,107,875 A * | 8/2000 | Pullen | H03F 3/2171 | 330/10 |
| 6,121,802 A * | 9/2000 | Luciano | H03K 4/06 | 327/131 |
| 6,154,090 A * | 11/2000 | Wissmach | H02M 1/4208 | 327/311 |
| 6,912,144 B1 * | 6/2005 | Clavette | H02M 3/1584 | 323/283 |
| 6,998,824 B2 * | 2/2006 | Nishimaki | H02M 1/38 | 323/222 |
| 7,046,080 B2 * | 5/2006 | Watts | H03F 3/217 | 330/10 |
| 7,294,993 B2 * | 11/2007 | Clavette | H02M 3/158 | 323/207 |
| 7,388,425 B2 * | 6/2008 | Lee | H03F 1/26 | 330/10 |
| 7,598,895 B1 * | 10/2009 | Khoury | H03K 7/08 | 341/152 |
| 7,768,246 B2 * | 8/2010 | Huang | H02M 1/143 | 323/282 |
| 8,095,090 B2 * | 1/2012 | Drogi | H03F 1/0205 | 455/114.3 |
| 8,208,876 B2 * | 6/2012 | Drogi | H03F 1/0205 | 330/10 |
| 8,238,853 B2 * | 8/2012 | Drogi | H03F 1/0205 | 330/127 |
| 8,260,225 B2 * | 9/2012 | Vinayak | H03F 1/0205 | 455/115.1 |
| 8,340,604 B2 * | 12/2012 | Drogi | H03F 1/0205 | 455/114.3 |
| 9,007,041 B2 * | 4/2015 | Lee | G05F 1/595 | 323/271 |
| 2003/0039134 A1 * | 2/2003 | Kolar | H02M 7/2173 | 363/126 |
| 2005/0110475 A1 * | 5/2005 | Chapuis | H02M 1/38 | 323/282 |
| 2005/0286643 A1 * | 12/2005 | Ozawa | H03L 7/087 | 375/242 |
| 2013/0121512 A1 * | 5/2013 | Chen | H03F 1/34 | 381/121 |
| 2013/0193882 A1 * | 8/2013 | Yun | H02P 3/00 | 318/400.1 |
| 2013/0249397 A1 * | 9/2013 | Chandran | H05B 37/0263 | 315/85 |
| 2014/0346569 A1 * | 11/2014 | Vielemeyer | H01L 21/8252 | 257/195 |
| 2015/0281831 A1 * | 10/2015 | Ibusuki | H03F 3/183 | 381/74 |
| 2016/0056771 A1 * | 2/2016 | Ibusuki | H03F 3/2171 | 381/123 |

* cited by examiner

LOOP GAIN

THD $f_A$  $f_{OSC1}$ $f_{OSC2}$

LOOP GAIN

THD $f_A$    $f_{OSC1}$ $f_{OSC2}$

SWITCHING CIRCUIT

CROSS-REFERENCE TO RELATED APPLICATIONS

The present invention claims priority under 35 U.S.C. §119 to Japanese Application No. 2014-166882, filed on Aug. 19, 2014, the entire content of which is incorporated herein by reference.

BACKGROUND OF THE INVENTION

Field of the Invention

The present invention relates to a switching circuit including a pulse modulator.

Description of the Related Art

In order to amplify an audio signal and to drive a speaker, a Class D amplifier (switching amplifier) is employed. FIG. 1 is a circuit diagram showing an audio system $1r$ including such a Class D amplifier.

The audio system $1r$ includes an audio amplifier integrated circuit (which will be referred to as the "audio amplifier IC" hereafter) $300r$, an output filter 106, and a speaker 108. The audio amplifier IC $300r$ mainly includes a switching output stage 301 and a pulse signal generator 303.

The pulse signal generator 303 generates a pulse modulated signal S5 according to an input audio signal S1. The switching output stage 301 includes a so-called Class D amplifier 310 and a pre-driver 308, and generates a switching pulse S2 according to the pulse modulated signal S5. The switching pulse S2 is input to the speaker 108 via the output filter 106. The switching signal S2 is converted by means of the output filter 106 into an audio signal S3 in the form of an analog signal.

A pulse modulator 306 generates the pulse modulated signal S5 having a duty ratio that is adjusted according to a signal S4 corresponding to the input audio signal S1. For example, the pulse modulator 306 is configured as an analog PWM (pulse width modulation) circuit including an oscillator 326 and a PWM comparator 328. The oscillator 326 generates a carrier signal S6 having a triangle waveform or otherwise a sawtooth waveform. The PWM comparator 328 compares the carrier signal S6 with the signal S4 corresponding to the input signal S1, so as to generate the pulse modulated signal S5. The pre-driver 308 drives the Class D amplifier 310 according to the pulse modulated signal S5 thus generated.

The switching pulse S2 has a voltage amplitude corresponding to a power supply voltage $V_{DD}$ of the class D amplifier 310. Accordingly, if there is a fluctuation in the power supply voltage $V_{DD}$, this leads to fluctuation in the amplitude of the analog audio signal S3. This leads to noise or otherwise fluctuation in the volume. In order to reduce the effect of the power supply voltage $V_{DD}$, an error amplifier 320 is provided. The error amplifier 320 includes a phase compensating filter 322, an operational amplifier 324, and a resistor R1. The phase compensating filter 322 is configured as a low-pass filter, and generates a feedback signal S7 according to the switching pulse S2. The operational amplifier 324 generates the error signal S4 corresponding to a difference between the input signal S1 and the feedback signal S7.

FIGS. 2A and 2B are diagrams each showing frequency characteristics of the audio system $1r$ shown in FIG. 1. FIG. 2A shows the loop gain of the audio system $1r$. FIG. 2B shows the THD (total harmonic distortion). Assuming that the loop gain of the audio amplifier IC $300r$ is designed such that it is optimized for a carrier signal S6 having a first frequency $f_{OSC1}$, in this case, after the loop gain is determined, the THD characteristic is determined according to the loop gain thus designed.

In some cases, depending on the usage of the audio system $1r$, there is a need to change the frequency of the carrier signal S6. Even if the audio amplifier IC $300r$ optimized for the first frequency $f_{OSC1}$ as shown in FIGS. 2A and 2B is operated with a second frequency $f_{OSC2}$ that is higher than the first frequency $f_{OSC1}$, the loop gain remains at the same level in the audio frequency band $f_A$. It is needless to say that the THD remains at the same level.

SUMMARY OF THE INVENTION

The present invention has been made in order to solve the aforementioned problem. Accordingly, it is an exemplary purpose of the present invention to provide a switching circuit that provides improved audio quality in high frequency operation.

An embodiment of the present invention relates to a switching circuit that generates a switching pulse that is pulse modulated according to an input signal. The switching circuit comprises: a switching output stage that comprises a high-side transistor and a low-side transistor, and that outputs the switching pulse according to a pulse modulated signal; an error amplifier that comprises a phase compensating filter that generates a feedback signal corresponding to the switching pulse, and that generates an error signal corresponding to a difference between the input signal and the feedback signal; and a pulse modulator that comprises an oscillator that generates a carrier signal having a variable frequency, and that pulse-modulates the carrier signal according to the error signal, so as to generate the pulse modulated signal. The phase compensating filter is configured such that the frequency characteristics thereof can be changed according to the frequency of the carrier signal.

With such an embodiment, the loop gain is designed for each frequency of the carrier signal, thereby providing improved sound quality in high frequency operation.

Also, the input signal may be configured as an analog audio signal. Also, the switching output stage may comprise: a Class D amplifier that comprises the high-side transistor and the low-side transistor; and a pre-driver that drives the Class D amplifier. Also, an electroacoustic transducer may be driven via a low-pass filter.

Also, the switching circuit may be employed in an audio system comprising a radio tuner. Also, the frequency of the carrier signal may be controlled according to a frequency that is being received by the radio tuner. Such an arrangement is capable of suppressing degradation in the sound quality of a radio receiver that can occur due to noise that occurs in a switching circuit.

Also, the switching circuit may further comprise a control interface circuit that receives, from an external micro controller, a control signal which instructs the frequency of the carrier signal.

Also, the switching circuit may further comprise a frequency measurement unit that measures a frequency of at least one from among the carrier signal, the switching pulse, and the pulse modulated signal.

Also, the error amplifier may further comprise: an operational amplifier that receives a reference voltage at a non-inverting input terminal thereof; and a first resistor having one end connected to an inverting input terminal of the operational amplifier, and the other end receiving the input signal. Also, the phase compensating filter may comprise: a feedback capacitor arranged between an output terminal and the inverting input terminal of the operational amplifier, and configured to have a variable capacitance; and a second resistor having one end connected to the inverting input terminal of the operational amplifier, and the other end receiving a switching signal corresponding to the switching pulse.

Also, the pulse modulator may comprise a PWM comparator that compares the carrier signal with the error signal.

Also, the switching circuit may monolithically be integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

By monolithically integrating the circuit on a single chip, such an arrangement allows the circuit area to be reduced, and allows the circuit elements to have uniform characteristics.

Another embodiment of the present invention relates to an audio amplifier integrated circuit. The audio amplifier integrated circuit comprises any one of the aforementioned switching circuits.

Also, the audio amplifier integrated circuit may further comprise: an audio interface circuit that receives an audio signal from a sound source; and a digital sound processor that performs digital signal processing on the audio signal received by the audio interface circuit, and that outputs the audio signal thus processed to the switching circuit.

Yet another embodiment of the present invention relates to an electronic device. The electronic device comprises: the aforementioned audio amplifier integrated circuit that outputs a switching pulse; an electroacoustic transducer; and an output filter that removes a high-frequency component from the switching pulse, and outputs the signal thus processed to the electroacoustic transducer.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 3:
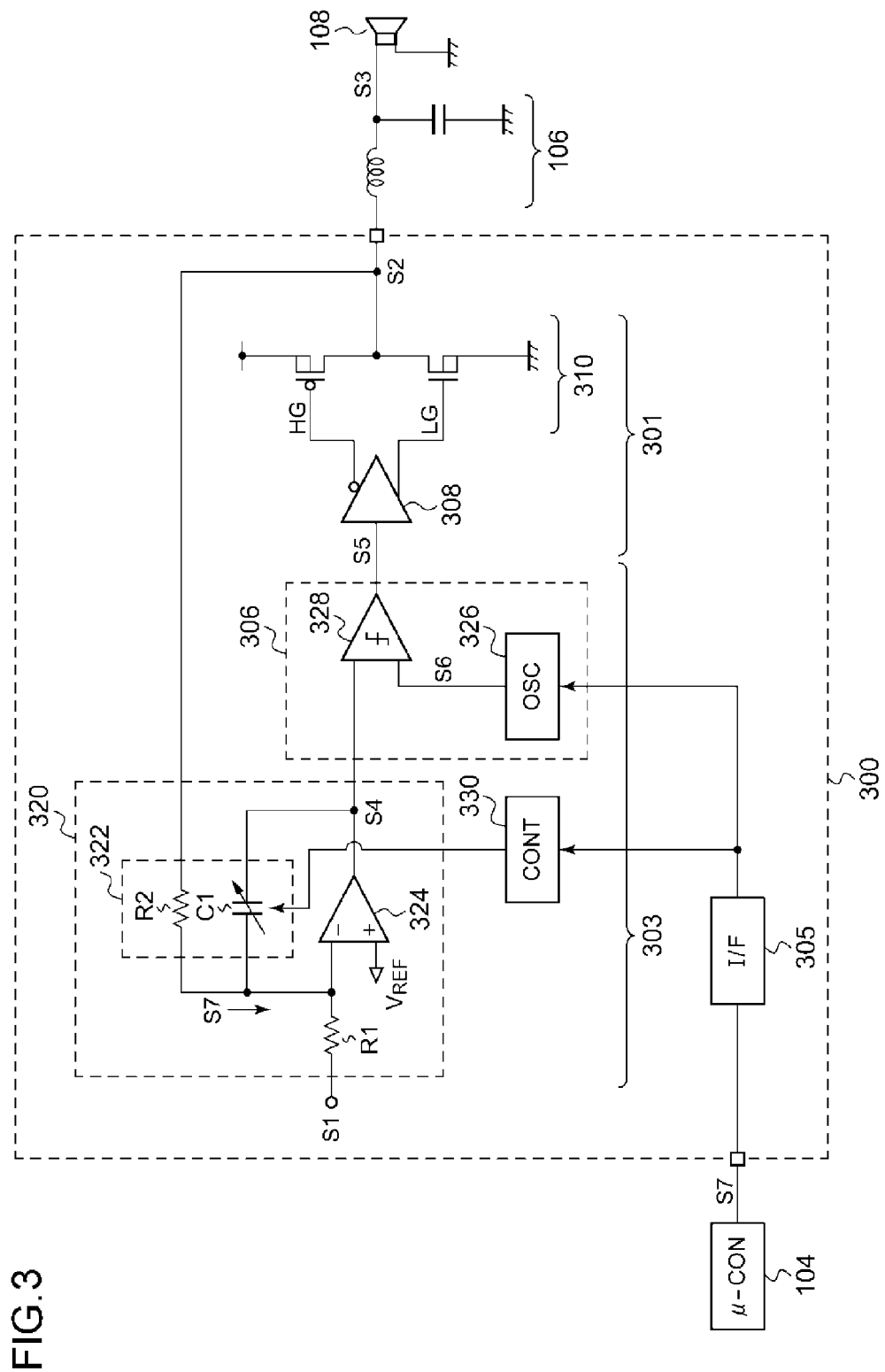
FIG. 3 is a circuit diagram showing an audio system according to an embodiment.

FIG. 3 is a circuit diagram showing an audio system 1 according to an embodiment. The audio system 1 includes a micro controller 104, an audio amplifier integrated circuit (IC) 300, an output filter 106, and a speaker 108. The audio amplifier IC 300 includes a switching output stage 301, a pulse signal generator 303, and a control interface circuit 305. The audio amplifier IC 300 is configured as a switching circuit that generates a switching pulse S2 that is pulse modulated according to an input signal S1.

The pulse signal generator 303 generates a pulse modulated signal S5 corresponding to the input audio signal S1. The switching output stage 301 includes a so-called Class D amplifier 310 and a pre-driver 308, and generates a switching pulse S2 corresponding to the pulse modulated signal S5. The switching pulse S2 is supplied to the speaker 108 via the output filter. The switching pulse S2 is converted into an analog audio signal S3 by means of the output filter 106.

The pulse signal generator 303 includes an error amplifier 320, a feedback controller 330, and a pulse modulator 306. The error amplifier 320 includes a phase compensating filter 322 that generates a feedback signal S7 corresponding to the switching pulse S2, and generates an error signal S4 corresponding to a difference between the input signal S1 and the feedback signal S7. More specifically, the error amplifier 320 includes the phase compensating filter 322, an operational amplifier 324, and a resistor R1. The phase compensating filer 322 is configured as a low-pass filter (integrator), and generates the feedback signal S7 corresponding to the switching pulse S2.

A reference voltage $V_{REF}$ is input to a non-inverting input terminal (+) of the operational amplifier 324. One end of the first resistor R1 is connected to an inverting input terminal (−) of the operational amplifier 324. The input signal S1 is input to the other end of the first resistor R1.

The phase compensating filer 322 includes a feedback capacitor C1 and a second resistor R2. The feedback capacitor C1 is arranged between the output terminal of the operational amplifier 324 and the inverting input terminal thereof. The feedback capacitor C1 is configured as a variable capacitor. The second resistor R2 is arranged such that one end thereof is connected to the inverting input terminal of the operational amplifier 324, and the other end thereof receives a switching signal (S2) corresponding to the switching pulse S2. FIG. 3 shows an example in which the switching pulse S2 is directly input to the second resistor R2 as such a switching signal without signal processing. Also, the switching pulse S2 may be input to the second resistor R2 via a buffer. Examples of such a switching signal that can be input to the second resistor R2 include: (i) the pulse modulated signal S5 output from the pulse modulator 306; (ii) a gate signal HG of a high-side transistor of the Class D amplifier 310; and (iii) a gate signal LG of a low-side transistor of the Class D amplifier 310. Such a switching signal may be indirectly input to the second resistor R2 via a buffer or an inverter. Also, such a switching signal may be directly input to the second resistor R2.

The pulse modulator 306 generates the pulse modulated signal S5 having a duty ratio that is adjusted according to the error signal S4. For example, the pulse modulator 306 is configured as an analog PWM (pulse width modulation) circuit including an oscillator 326 and a PWM comparator 328. The oscillator 326 generates a carrier signal S6 having a triangle waveform or otherwise a sawtooth waveform. The PWM comparator 328 compares the carrier signal S6 with the signal S4 corresponding to the input signal S1, so as to generate the pulse modulated signal S5. The pre-driver 308 drives the Class D amplifier 310 according to the pulse modulated signal S5 thus generated. The pulse modulator 306 is configured to adjust the frequency of the carrier signal S6. That is to say, the oscillator 326 is configured as a variable oscillator.

The interface circuit 305 receives, from an external micro controller 104, a control signal S8 which instructs the frequency $f_{OSC}$ of the carrier signal S6. The control signal S8 may be configured as parallel data or otherwise serial data. The oscillator 326 generates the carrier signal S6 having a frequency corresponding to the control signal S8. The feedback controller 330 controls the frequency characteristics of the phase compensating filter 322, i.e., the loop gain characteristic, according to the control signal S8. Specifically, the feedback controller 330 reduces the capacitance of the feedback capacitor C1 according to an increase in the frequency of the carrier signal S6. With such an arrangement, as the frequency of the carrier signal S6 becomes higher, the bandwidth of the feedback loop becomes larger.

Figure 1:
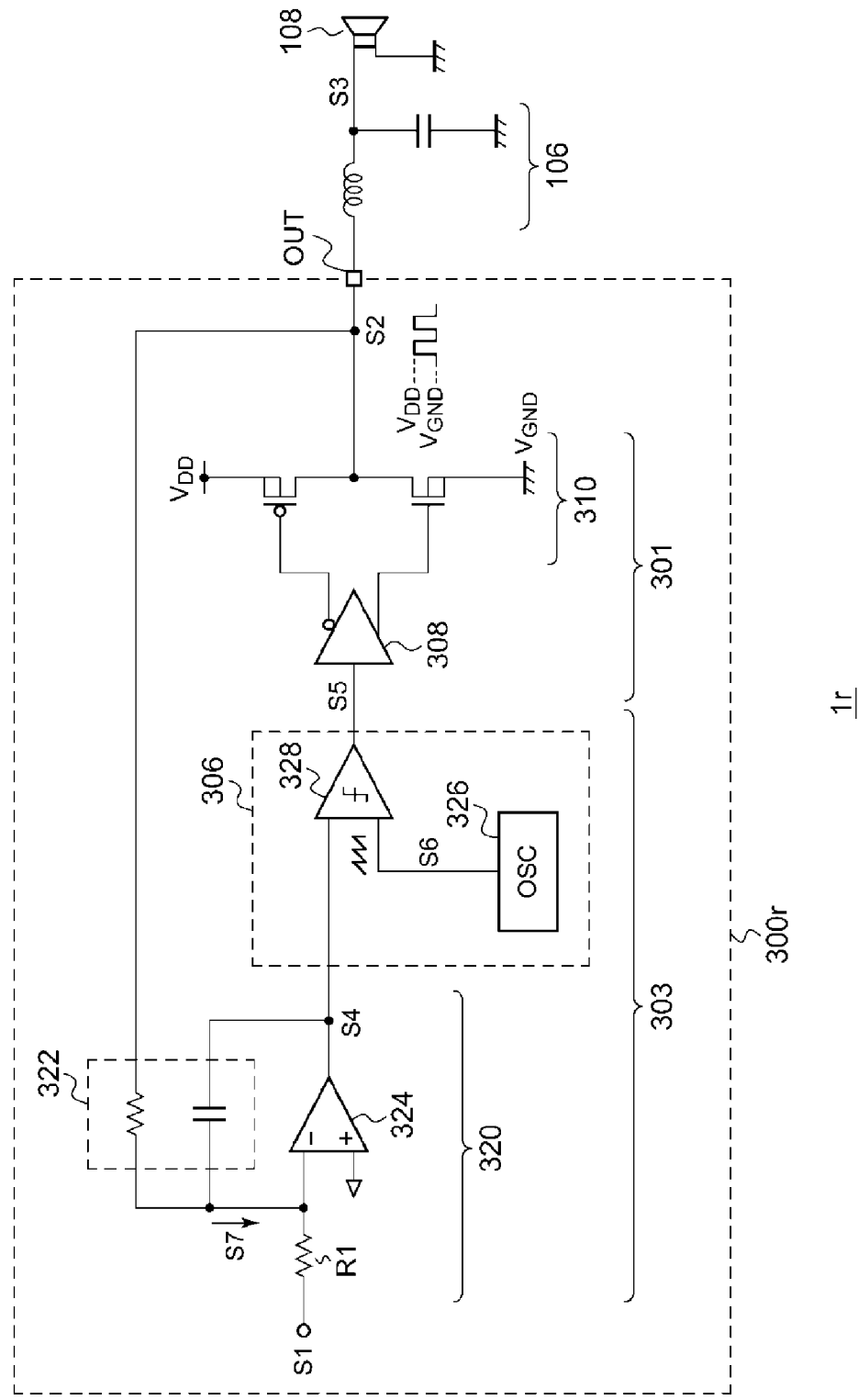
FIG. 1 is a circuit diagram showing an audio system including a Class D amplifier.
Figure 2A:
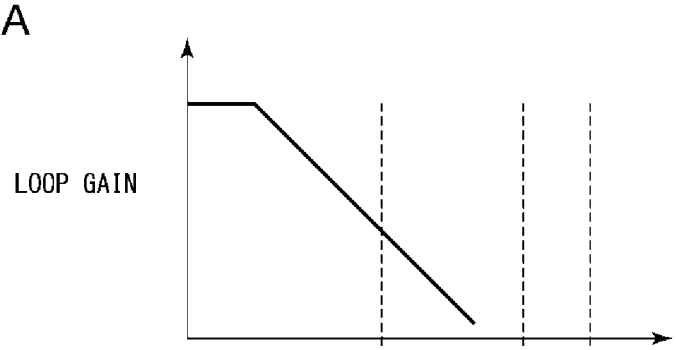
FIGS. 2A and 2B are diagrams each showing the frequency characteristics of the audio system shown in FIG. 1.
Figure 2B:
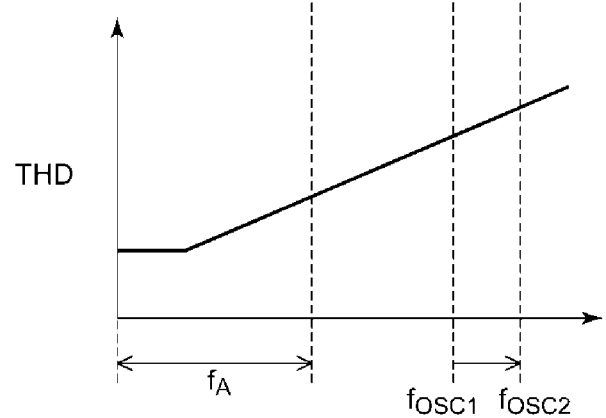
Figure 4A:
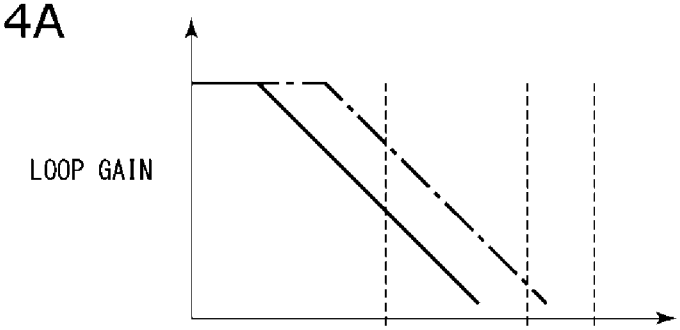
FIGS. 4A and 4B are diagrams each showing the frequency characteristics of the audio system shown in FIG. 3.
Figure 4B:
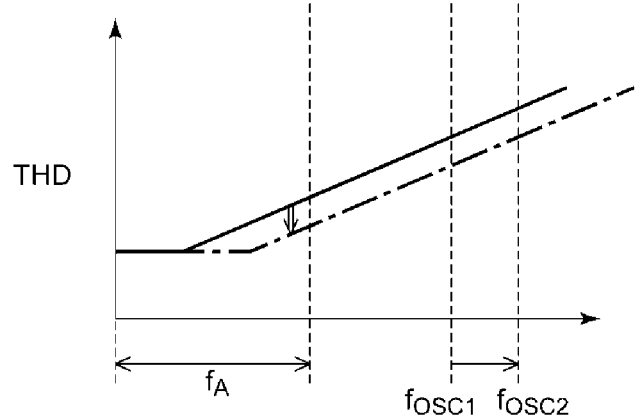

The above is the configuration of the audio amplifier IC 300. Next, description will be made regarding the operation thereof. FIGS. 4A and 4B are diagrams each showing the frequency characteristics of the audio system 1 shown in FIG. 3. FIG. 2A shows the loop gain, and FIG. 2B shows the THD (total harmonic distortion). Description will be made below regarding an arrangement in which the carrier frequency (i.e., switching frequency) $f_{OSC}$ is switched between two values, i.e., between $f_{OSC1}$ and $f_{OSC2}$.

When the carrier frequency $f_{OSC}$ is set to the first value $f_{OSC1}$ which is a relatively low value, the feedback controller 330 sets the capacitance of the feedback capacitor C1 to a first value $C1_1$. In this case, the loop gain characteristic and the THD characteristic thus become as indicated by (i).

When the carrier frequency $f_{OSC}$ is set to a second value $f_{OSC2}$ which is a relatively high value, the feedback controller 330 sets the capacitance of the feedback capacitor C1 to a second value $C1_2$. In this case, the loop gain characteristic and the THD characteristic thus become as indicated by (ii). That is to say, when the carrier frequency (switching frequency) $f_{OSC}$ becomes higher, the frequency band of the feedback loop is extended toward the high-frequency side according to the increase in the carrier frequency $f_{OSC}$. Thus, such an arrangement is capable of providing improved sound quality in a high frequency operation as represented by an index such as the THD characteristic as compared with an arrangement in which the feedback capacitor C1 has a fixed capacitance.

[Usage]

Next, description will be made regarding the usage of the audio system 1.

Figure 5:
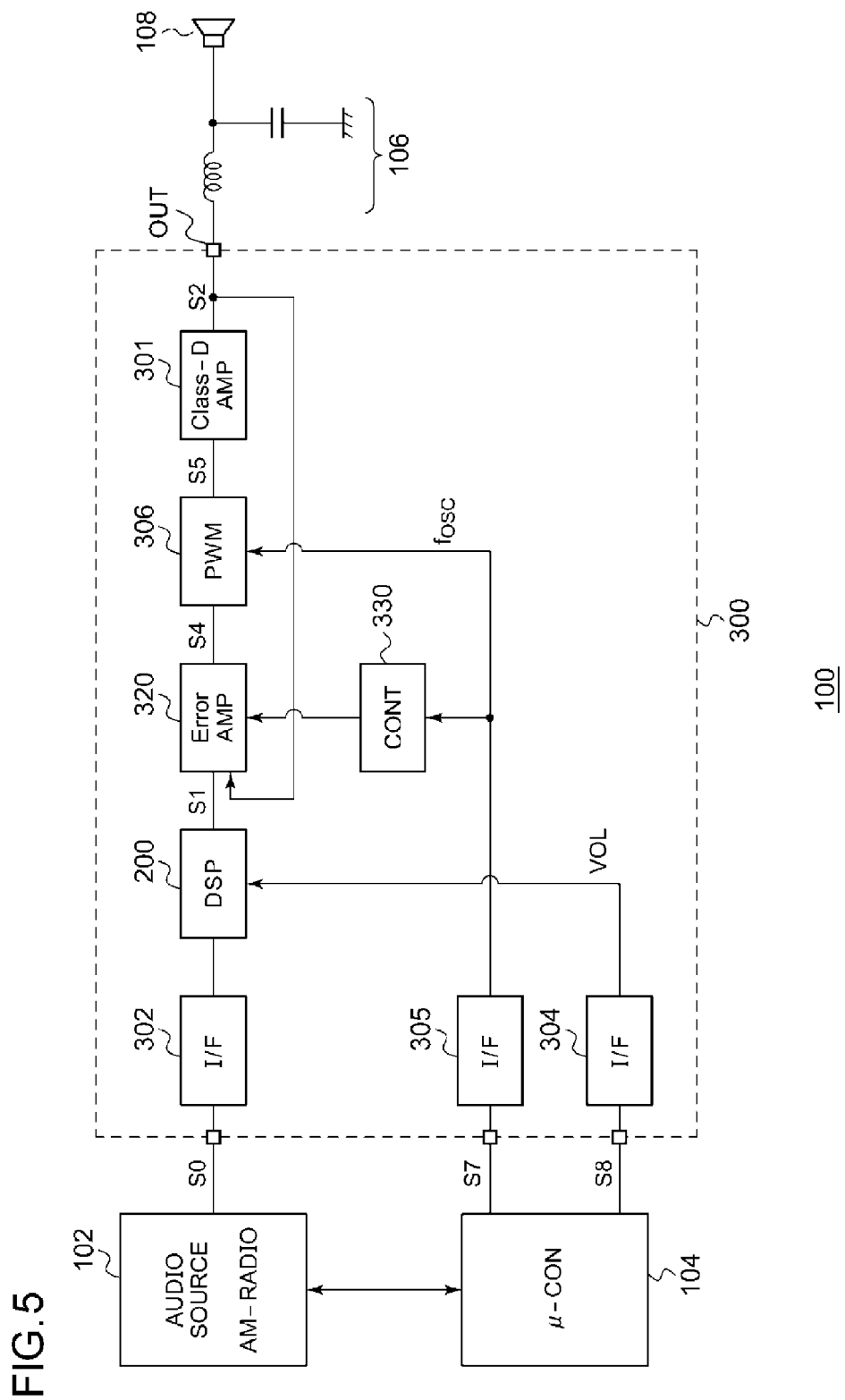
FIG. 5 is a block diagram showing an electronic device including an audio amplifier IC.

FIG. 5 is a block diagram showing an electronic device including the audio amplifier IC 300.

The electronic device 100 includes a sound source 102, a micro controller 104, the audio amplifier IC 300, an output filter 106, and a speaker 108.

The sound source 102 is configured as a CD player, DVD player, portable audio apparatus, AM radio tuner, FM radio tuner, or the like. The sound source 102 generates an audio signal S0 in the form of a digital signal or otherwise an analog signal. The audio amplifier IC 300 further includes an interface circuit 304, an interface circuit 302, and a DSP (Digital Sound Processor) 200, in addition to the components of the audio amplifier IC 300 shown in FIG. 3.

The interface circuit 302 receives the audio signal S0 from the sound source 102. The interface circuit 302 may include a serial interface circuit that receives the audio signal S0 in a digital/serial format via an I²S (Inter IC Sound) bus. Also, the interface circuit 302 may include an A/D converter that converts the analog audio signal S0 into a digital audio signal.

The micro controller 104 integrally controls the overall operation of the electronic device 100. The micro controller 104 selects the kind of sound source 102 according to the user's input. Furthermore, the micro controller 104 and the interface circuit 304 are connected to each other via an I²C (Inter IC) bus or the like, which allows control data S9 including a volume setting value VOL and the like to be transmitted in a serial format.

The DSP 200 performs predetermined digital signal processing on an audio signal received by the interface circuit 302. The DSP 200 may include a sound processor, multiband equalizer, balance circuit, fader circuit, pre-scaler, bus booster circuit, etc. Also, the order of the signal processing steps provided by the respective blocks is not restricted in particular. The audio signal subjected to the processing by means of the DSP 200 is converted into the audio signal S1 in the form of an analog signal, and is output to the error amplifier 320.

In ordinary operations, the audio amplifier IC 300 performs a switching operation with the first frequency $f_{OSC1}$. Here, let us say that the user selects a radio tuner as the sound source 102, and the user sets the reception frequency to a value $f_{AM}$ in the vicinity of the first frequency $f_{OSC1}$. In this case, the micro controller 104 selects the radio tuner as the sound source 102, and sets the reception frequency to $f_{AM}$. In this stage, the micro controller 104 sets the switching frequency (carrier frequency) $f_{OSC}$ of the audio amplifier IC 300 to the frequency $f_{OSC2}$ that is distant from the reception frequency $f_{AM}$.

The above is the configuration of the electronic device 100. With the electronic device 100, the frequency of the switching noise of the Class D amplifier is adjusted such that it is outside of the radio reception frequency band. Furthermore, the frequency band of the feedback loop is controlled according to the change of the switching frequency $f_{OSC}$, thereby suppressing degradation in the sound quality.

Figure 6A:
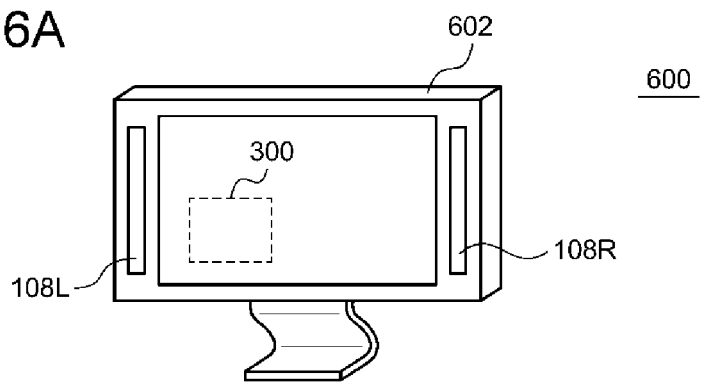
FIGS. 6A through 6C are external views each showing an electronic device.
Figure 6B:
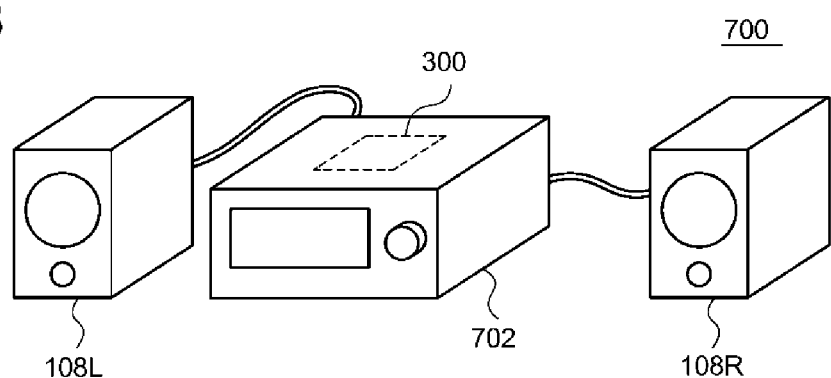
Figure 6C:
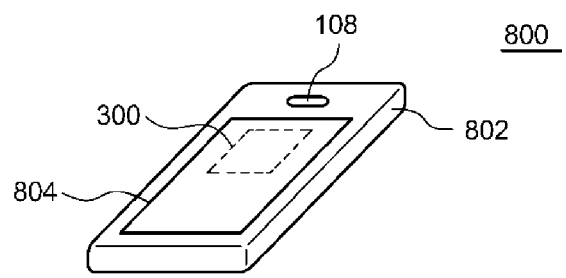

FIGS. 6A through 6C are external views each showing the electronic device 100. FIG. 6A shows a display apparatus 600 configured as an example of the electronic device 100. The display apparatus 600 includes a casing 602 and speakers 108L and 108R. The audio amplifier IC 300 is built into the casing 602, and drives the speakers 108L and 108R.

FIG. 6B shows an audio component 700 configured as an example of the electronic device 100. The audio component 700 includes a casing 702 and speakers 108L and 108R. The audio amplifier IC 300 is built into the casing 702, and drives the speakers 108L and 108R. The electronic device 100 may be configured as a home audio apparatus or a car audio apparatus. Also, the electronic device 100 may be configured as a radio-cassette player having a configuration in which the speakers 108 are monolithically mounted on the casing 702.

FIG. 6C shows a compact information terminal 800 configured as an example of the electronic device 100. Examples of such a compact information terminal 800 include a cellular phone, PHS (Personal Handy-phone System), PDA (Personal Digital Assistant), tablet PC (Personal Computer), audio player, and the like. The compact information terminal 800 includes a casing 802, a speaker 108, and a display 804. The audio amplifier IC 300 is built into the casing 802, and drives the speaker 108.

By providing the audio amplifier IC 300 to the electronic devices as shown in FIGS. 6A through 6C, such an arrangement is capable of providing high sound quality. In addition, the audio amplifier IC 300 may be applied to an intercom or the like.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Description has been made in the embodiment regarding an arrangement in which the carrier frequency is switched between two values. Also, the carrier frequency $f_{OSC}$ may be switched between three or more values. In this case, the frequency characteristic of the phase compensating filter 322 may be selected from among two values in the same manner as in the embodiment. Also, the frequency characteristic of the phase compensating filter 322 may be selected from among three or more values.

Second Modification

Figure 7A:
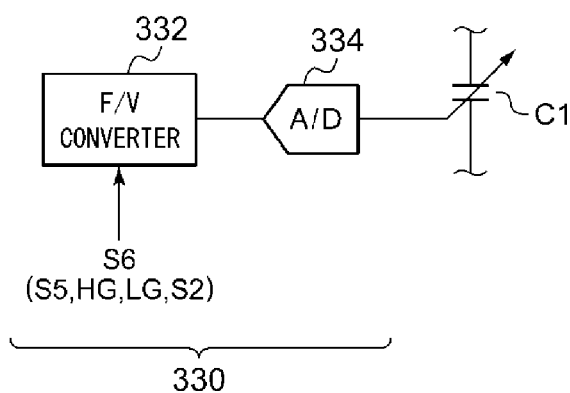
FIGS. 7A and 7B are block diagrams each showing a feedback controller according to a modification.
Figure 7B:
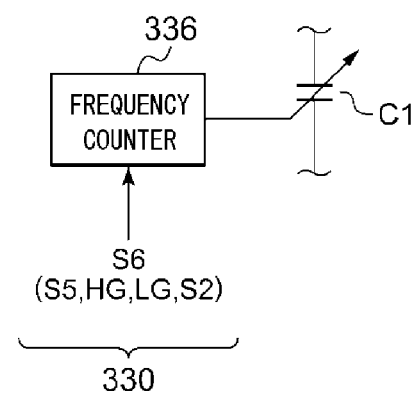

Description has been made in the embodiment regarding an arrangement in which the frequency characteristic of the phase compensating filter 322 is controlled according to the control signal S8 received from the micro controller 104. However, the present invention is not restricted to such an arrangement. FIGS. 7A and 7B are block diagrams each showing the feedback controller 330 according to a modification. The feedback controller 330 shown in FIG. 7A includes a frequency/voltage (F/V) converter 332 and an A/D converter 334. The F/V converter 332 receives the carrier signal S6, and converts the carrier signal S6 into a voltage corresponding to the frequency of the carrier signal S6. The A/D converter 334 quantizes the output voltage of the F/V converter 332, and selects the capacitance of the feedback capacitor C1 based on the quantized value thus obtained. Instead of the carrier signal S6, the F/V converter 332 may convert the frequency of a different signal, such as the pulse modulated signal S5, gate signal HG of the high-side transistor, gate signal LG of the low-side transistor, or the switching pulse S2, into a voltage.

The feedback controller 330 shown in FIG. 7B includes a frequency counter 336. The frequency counter 336 receives the carrier signal S6, and counts the frequency (period) of the carrier signal S6 using a clock signal. The capacitance of the feedback capacitor C1 is controlled according to the count value of the frequency counter 336. Instead of the carrier signal S6, the frequency counter 336 may count the frequency of a different signal such as the pulse modulated signal S5, gate signal HG of the high-side transistor, gate signal LG of the low-side transistor, or the switching pulse S2.

Third Embodiment

Figure 8:
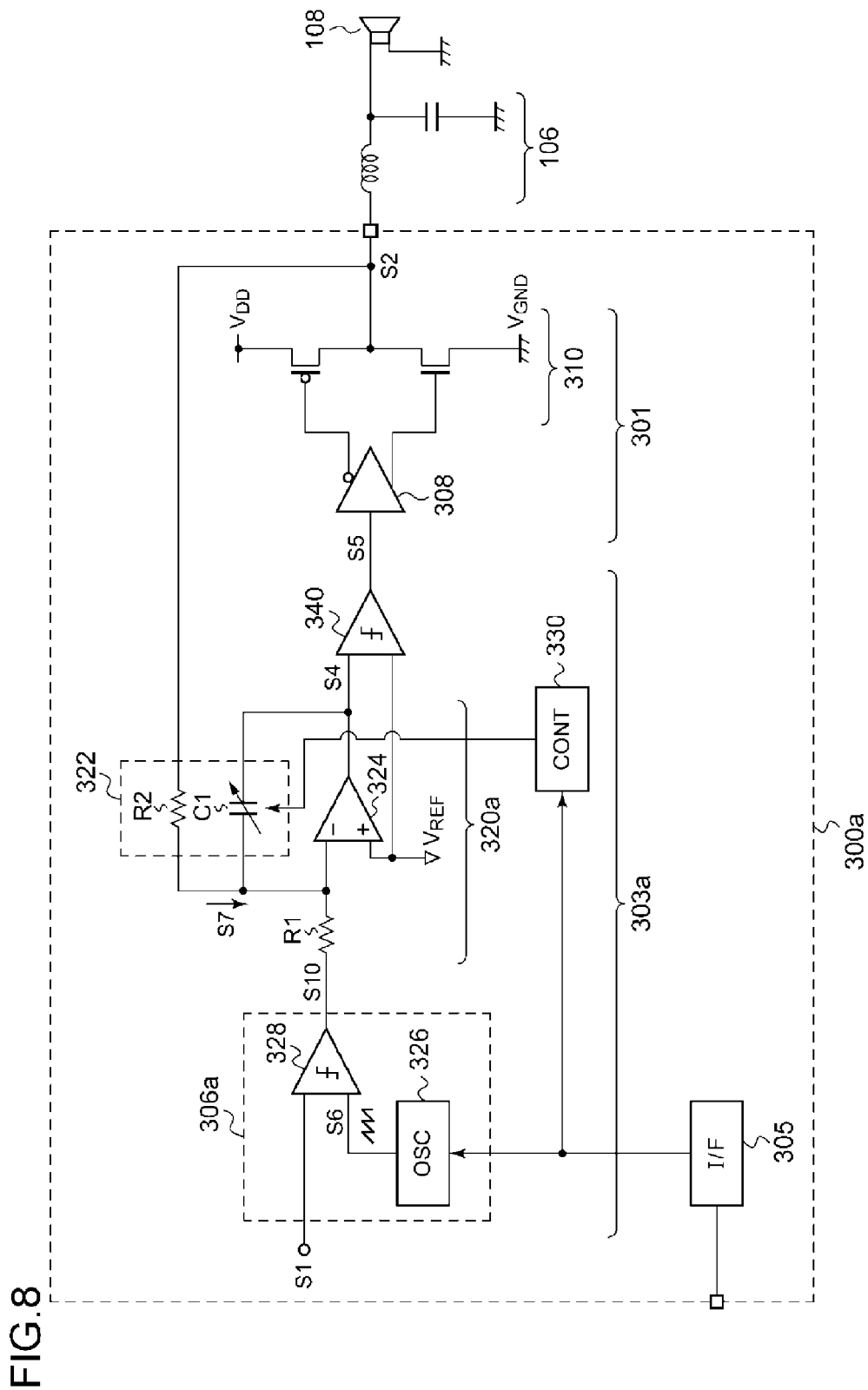
FIG. 8 is a circuit diagram showing an audio amplifier IC according to a third modification.

FIG. 8 is a circuit diagram showing an audio amplifier IC 300a according to a third modification. In the audio amplifier IC 300a, the pulse signal generator 303a has a configuration that differs from that of the pulse signal generator 303 shown in FIG. 3.

The audio amplifier IC 300a generates the switching pulse S2 according to an input pulse signal S10 generated by pulse modulating the carrier signal S6 having a variable frequency. The pulse modulator 306a generates the input signal S10 pulse width modulated such that it has a duty ratio corresponding to the analog audio signal S1. FIG. 8 shows an arrangement in which the pulse modulator 306a has the same configuration as that of the pulse modulator 306 shown in FIG. 3. Also, the pulse modulator 306a may be configured as a digital circuit.

The phase compensating filter 322 generates the feedback signal S7 corresponding to the switching pulse S2. The operational amplifier 324 generates the error signal S4 corresponding to a difference between the input pulse signal S10 and the feedback signal S7. A PWM comparator 340a compares the error signal S4 with a reference voltage $V_{REF}$ so as to generate the pulse modulated signal S5.

The phase compensating filter 322 is configured such that its frequency characteristics can be adjusted according to the frequency $f_{OSC}$ of the carrier signal S6.

Such a modification provides the same effects as those provided by the embodiment. Also, the third modification may be combined with the first or second modification.

Fourth Modification

Figure 9:
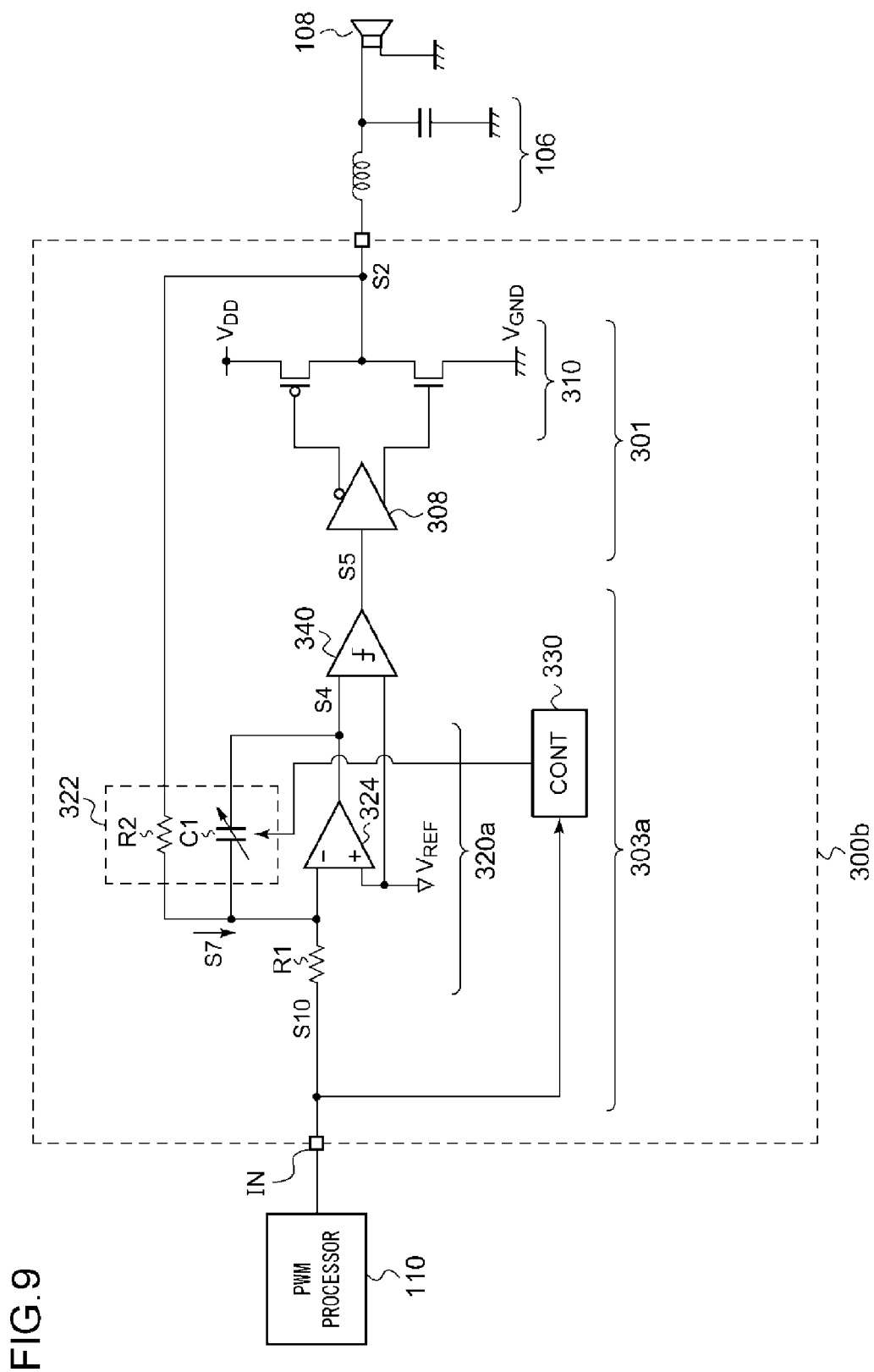
FIG. 9 is a circuit diagram showing an audio amplifier IC according to a fourth modification.

FIG. 9 is a circuit diagram showing an audio amplifier IC 300b according to a fourth modification. In this modification, the input pulse signal S10 generated by an external PWM processor 110 is input to an input terminal IN of the audio amplifier IC 300b. The error amplifier 320a has the same configuration as that shown in FIG. 8. The feedback controller 330 receives the input pulse signal S10, detects the frequency of the input pulse signal S10, and controls the loop gain of the phase compensating filter 322. The feedback controller 330 may employ the same configuration as that shown in FIG. 7A or 7B. Such a modification also provides the same effects as those provided by the embodiment.

Fifth Modification

Description has been made in the embodiment regarding the audio amplifier IC 300 having a single-ended type output stage. However, the present invention is not restricted to such an arrangement. Also, the present invention may be applied to the audio amplifier IC 300 having a BTL (Bridge Transformer Less) type output stage or otherwise a differential type output stage.

While the preferred embodiments of the present invention have been described using specific terms, such description is for illustrative purposes only, and it is to be understood that changes and variations may be made without departing from the spirit or scope of the appended claims.

What is claimed is:

1. A switching circuit that generates a switching pulse that is pulse modulated according to an input signal, the switching circuit comprising:
    a switching output stage that comprises a high-side transistor and a low-side transistor, and that outputs the switching pulse according to a pulse modulated signal;
    an error amplifier that comprises a phase compensating filter that generates a feedback signal corresponding to the switching pulse, and that generates an error signal corresponding to a difference between the input signal and the feedback signal; and
    a pulse modulator that comprises an oscillator that generates a carrier signal having a variable frequency, and that pulse-modulates the carrier signal according to the error signal, so as to generate the pulse modulated signal,
    wherein the phase compensating filter is configured such that the frequency characteristics thereof can be changed according to the frequency of the carrier signal, and wherein the error amplifier further comprises:
    an operational amplifier that receives a reference voltage at a non-inverting input terminal thereof; and
    a first resistor having one end connected to an inverting input terminal of the operational amplifier and the other end receiving the input signal,
    and wherein the phase compensating filter comprises:
        a feedback capacitor arranged between an output terminal and the inverting input terminal of the operational amplifier, and configured to have a variable capacitance; and
        a second resistor having one end connected to the inverting input terminal of the operational amplifier and the other end receiving a switching signal corresponding to the switching pulse.

2. The switching circuit according to claim 1, wherein the input signal is configured as an analog audio signal,
    wherein the switching output stage comprises:
        a Class D amplifier that comprises the high-side transistor and the low-side transistor; and
        a pre-driver that drives the Class D amplifier,
    and wherein an electroacoustic transducer is driven via a low-pass filter.

3. The switching circuit according to claim 1, employed in an audio system comprising a radio tuner, wherein the frequency of the carrier signal is controlled according to a frequency that is being received by the radio tuner.

4. The switching circuit according to claim 2, further comprising a control interface circuit that receives, from an external micro controller, a control signal which instructs the frequency of the carrier signal.

5. The switching circuit according to claim 2, further comprising a frequency measurement unit that measures a frequency of at least one from among the carrier signal, the switching pulse, and the pulse modulated signal.

6. The switching circuit according to claim 2, wherein the pulse modulator comprises a PWM comparator that compares the carrier signal with the error signal.

7. The switching circuit according to claim 1, monolithically integrated on a single semiconductor substrate.

8. An audio amplifier integrated circuit comprising the switching circuit according to claim 2.

9. The audio amplifier integrated circuit according to claim 8, further comprising:
    an audio interface circuit that receives an audio signal from a sound source; and
    a digital sound processor that performs digital signal processing on the audio signal received by the audio interface circuit, and that outputs the audio signal thus processed to the switching circuit.

10. An electronic device comprising:
    the audio amplifier integrated circuit according to claim 8, that outputs a switching pulse;
    an electroacoustic transducer; and
    an output filter that removes a high-frequency component from the switching pulse, and outputs the signal thus processed to the electroacoustic transducer.

11. A switching circuit that generates a switching pulse according to an input pulse signal generated by pulse modulating a carrier signal having a variable frequency, the switching circuit comprising:
    a switching output stage that comprises a high-side transistor and a low-side transistor, and that outputs the switching pulse corresponding to a pulse modulated signal;
    an error amplifier that comprises a phase compensating filter that generates a feedback signal corresponding to the switching pulse, and that generates an error signal corresponding to a difference between the input pulse signal and the feedback signal; and
    a pulse modulator that compares the error signal with a reference voltage, so as to generate the pulse modulated signal,
    wherein the phase compensating filter is configured such that frequency characteristics thereof can be changed according to the frequency of the carrier signal, wherein the error amplifier further comprises:
    an operational amplifier that receives a reference voltage at a non-inverting input terminal thereof; and
    a first resistor having one end connected to an inverting input terminal of the operational amplifier and the other end receiving the input pulse signal,
    and wherein the phase compensating filter comprises:
        a feedback capacitor arranged between an output terminal and the inverting input terminal of the operational amplifier, and configured to have a variable capacitance; and
        a second resistor having one end connected to the inverting input terminal of the operational amplifier and the other end receiving a switching signal corresponding to the switching pulse.

12. The switching circuit according to claim 11, wherein the input pulse signal is generated by pulse width modulating the carrier signal according to an analog audio signal, wherein the switching output stage comprises:
- a Class D amplifier that comprises the high-side transistor and the low-side transistor; and
- a pre-driver that drives the Class D amplifier, and wherein an electroacoustic transducer is driven via a low-pass filter.

13. The switching circuit according to claim 12, employed in an audio system comprising a radio tuner, wherein the frequency of the carrier signal is controlled according to a frequency that is being received by the radio tuner.

14. The switching circuit according to claim 12, further comprising a control interface circuit that receives, from an external micro controller, a control signal which instructs the frequency of the carrier signal.

15. The switching circuit according to claim 12, further comprising a frequency measurement unit that measures a frequency of at least one from among the carrier signal, the switching pulse, and the pulse modulated signal.

16. The switching circuit according to claim 12, further comprising:
- an oscillator that generates the carrier signal with a variable frequency; and
- a PWM comparator that compares the carrier signal with the analog audio signal.

17. An audio amplifier integrated circuit comprising the switching circuit according to claim 12.

18. The audio amplifier integrated circuit according to claim 17, further comprising:
- an audio interface circuit that receives an audio signal from a sound source; and
- a digital sound processor that performs digital signal processing on the audio signal received by the audio interface circuit, and that outputs the audio signal thus processed to the switching circuit.

19. An electronic device comprising:
- the audio amplifier integrated circuit according to claim 17, that outputs a switching pulse;
- an electroacoustic transducer; and
- an output filter that removes a high-frequency component from the switching pulse, and outputs the signal thus processed to the electroacoustic transducer.

* * * * *